(12) United States Patent
Iwahori

(10) Patent No.: US 11,296,230 B2
(45) Date of Patent: Apr. 5, 2022

(54) SEMICONDUCTOR INTEGRATED CIRCUIT DEVICE

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/931,693

(22) Filed: Jul. 17, 2020

(65) Prior Publication Data

US 2020/0350439 A1 Nov. 5, 2020

Related U.S. Application Data

(63) Continuation of application No. PCT/JP2018/001655, filed on Jan. 19, 2018.

(51) Int. Cl.
*H01L 29/786* (2006.01)
*H01L 27/088* (2006.01)

(52) U.S. Cl.
CPC ...... *H01L 29/78642* (2013.01); *H01L 27/088* (2013.01); *H01L 29/78696* (2013.01)

(58) Field of Classification Search
CPC ......... H01L 29/78642; H01L 29/78696; H01L 27/088
USPC ........................................................ 257/329
See application file for complete search history.

(56) References Cited

U.S. PATENT DOCUMENTS

| | | | |
|---|---|---|---|
| 2008/0169487 A1* | 7/2008 | Shimbo | H01L 27/0207 257/207 |
| 2012/0168875 A1 | 7/2012 | Tamaru et al. | |
| 2016/0012169 A1 | 1/2016 | Chiang et al. | |
| 2016/0063163 A1* | 3/2016 | Moroz | G06F 30/39 716/110 |
| 2016/0172351 A1 | 6/2016 | Shimbo | |
| 2017/0213814 A1 | 7/2017 | Thazhathidathil et al. | |
| 2020/0335488 A1* | 10/2020 | Iwahori | H01L 29/7827 |

FOREIGN PATENT DOCUMENTS

| | | |
|---|---|---|
| JP | 2005-340461 A | 12/2005 |
| JP | 2011-134838 A | 7/2011 |
| WO | 2011/077664 A1 | 6/2011 |
| WO | 2015/029280 A1 | 3/2015 |

OTHER PUBLICATIONS

International Search Report issued in International Patent Application No. PCT/JP2018/001655, dated Apr. 3, 2018; with partial English translation.
Written Opinion of International Search Authority issued in International Patent Application No. PCT/JP2018/001655, dated Apr. 3, 2018; with partial English translation.

\* cited by examiner

*Primary Examiner* — Tong-Ho Kim

(74) *Attorney, Agent, or Firm* — McDermott Will & Emery LLP

(57) ABSTRACT

A semiconductor integrated circuit device provided with vertical nanowire (VNW) FETs includes a tap cell. The tap cell includes a power supply interconnect extending in a first direction and a bottom region of a first conductivity type formed in a top portion of a well or substrate of the first conductivity type. The bottom region overlaps the power supply interconnect as viewed from top and is connected with the power supply interconnect.

7 Claims, 13 Drawing Sheets

FIG.1
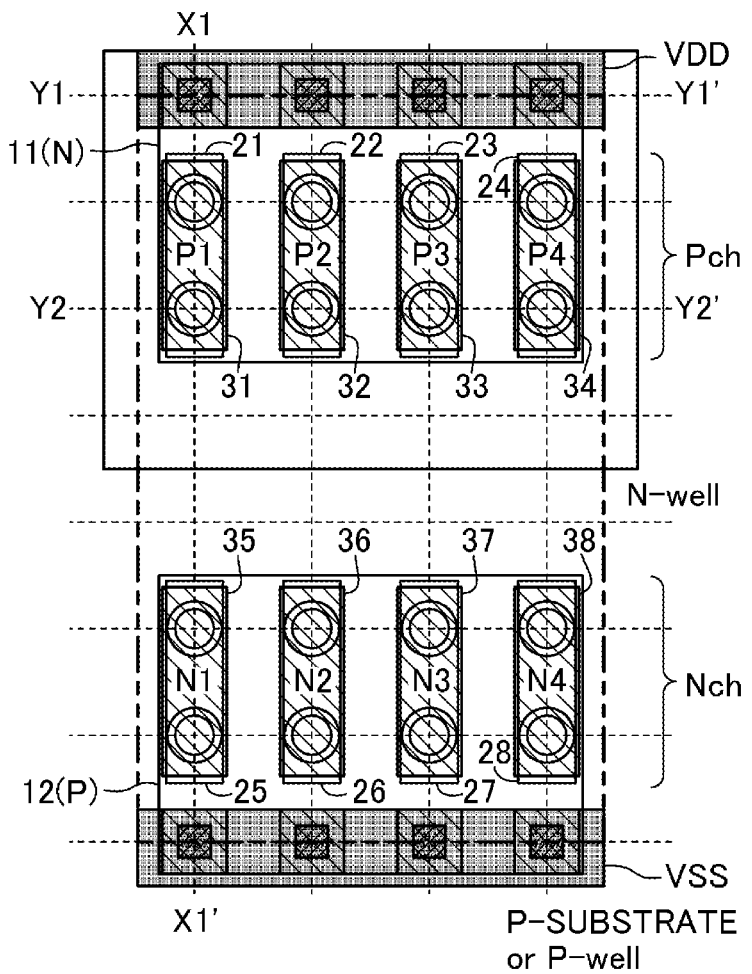
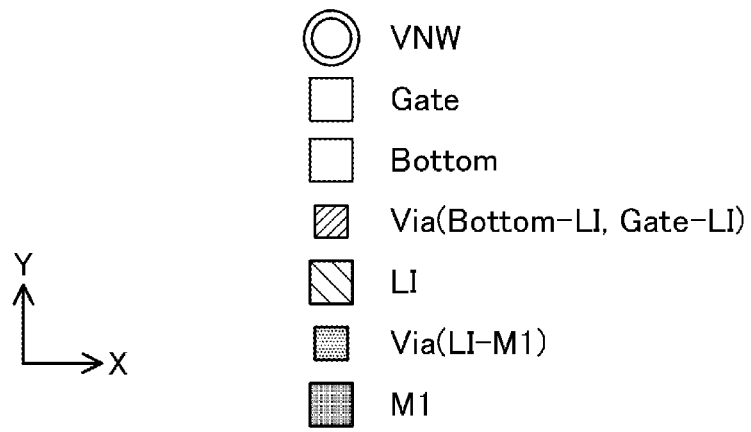

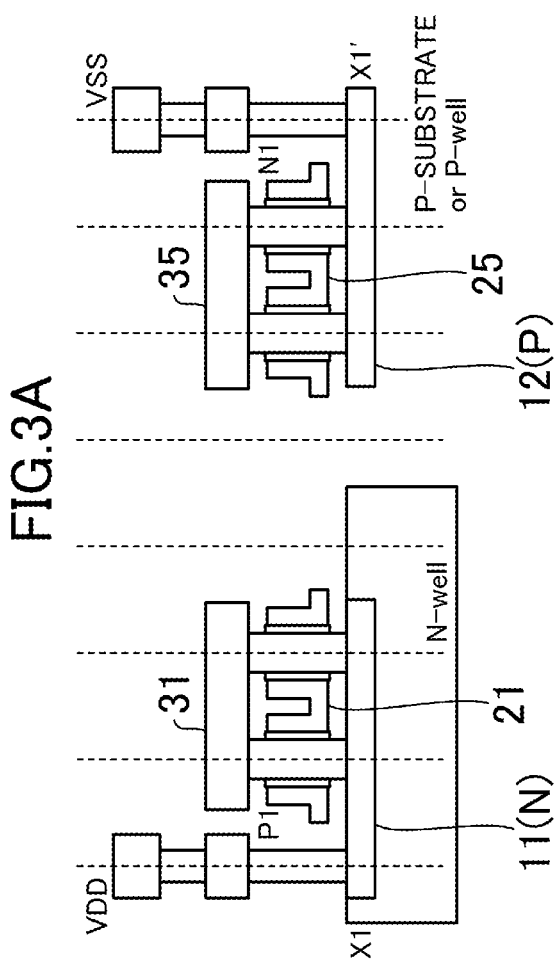
FIG.3A
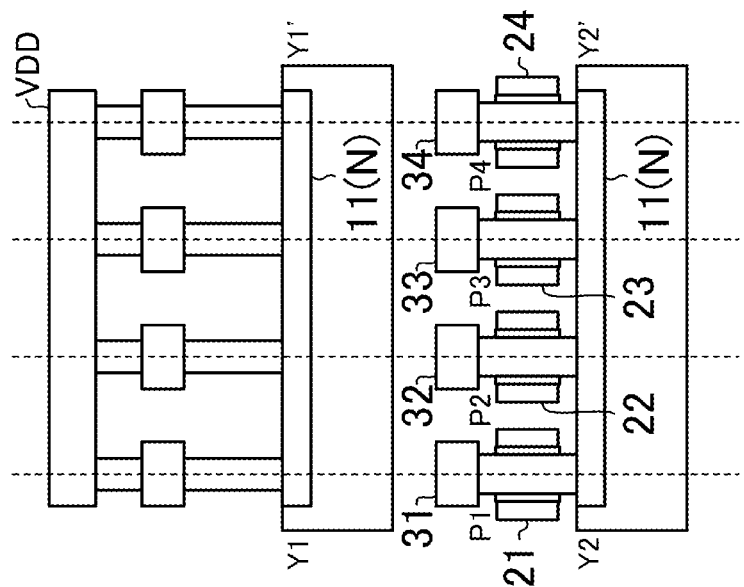
FIG.3B
FIG.3C

FIG.5
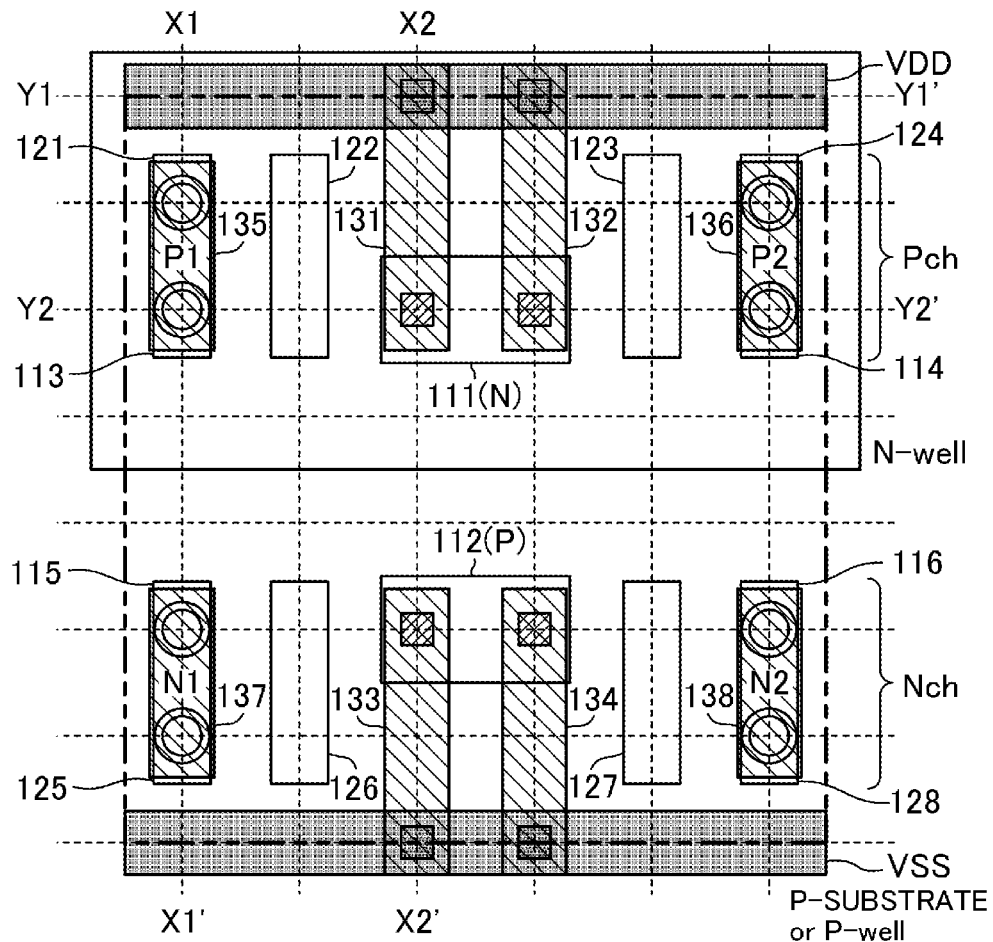
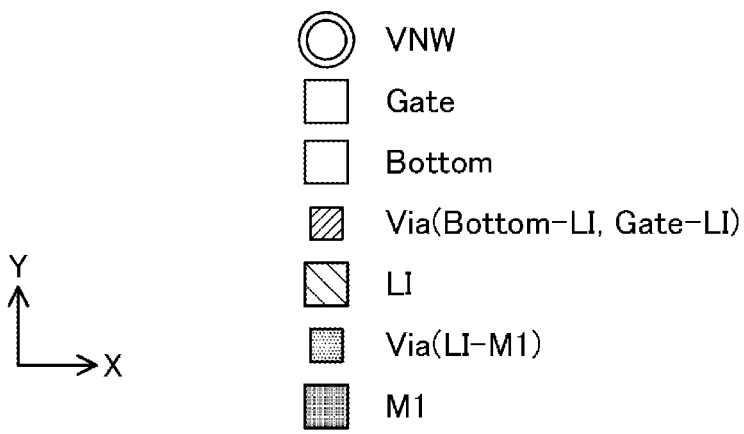

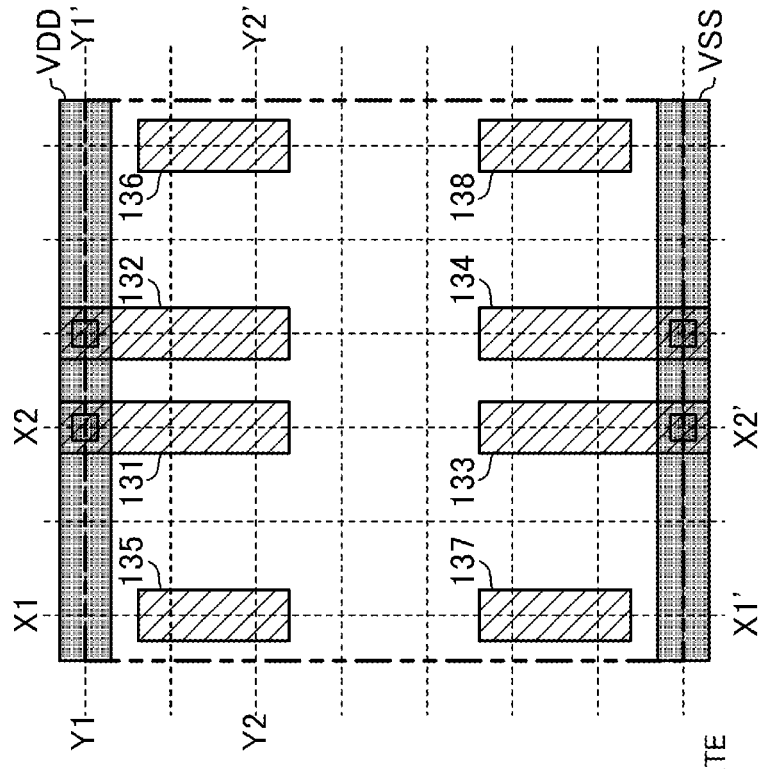
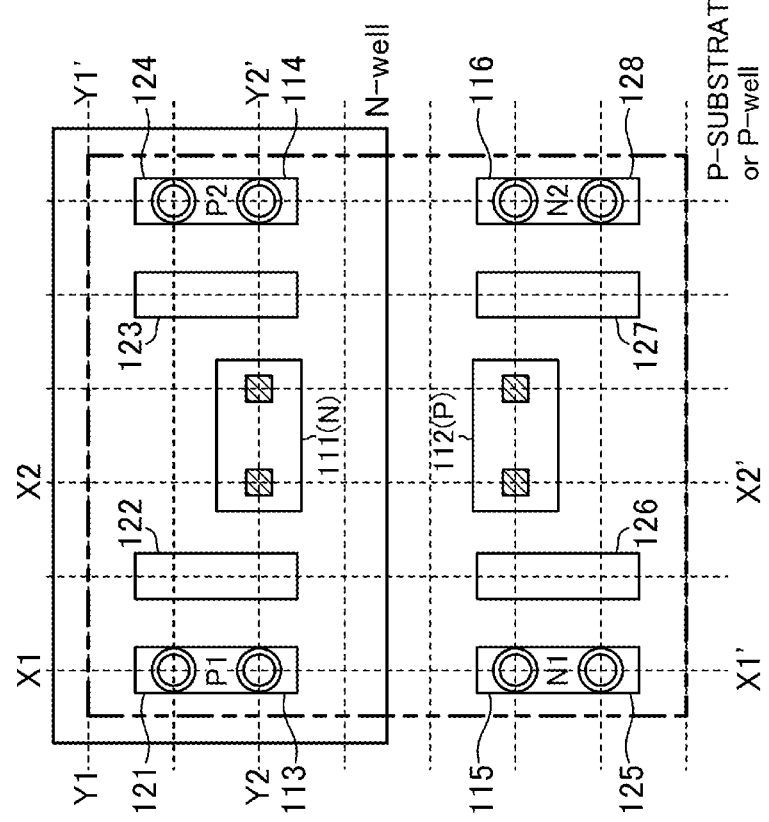

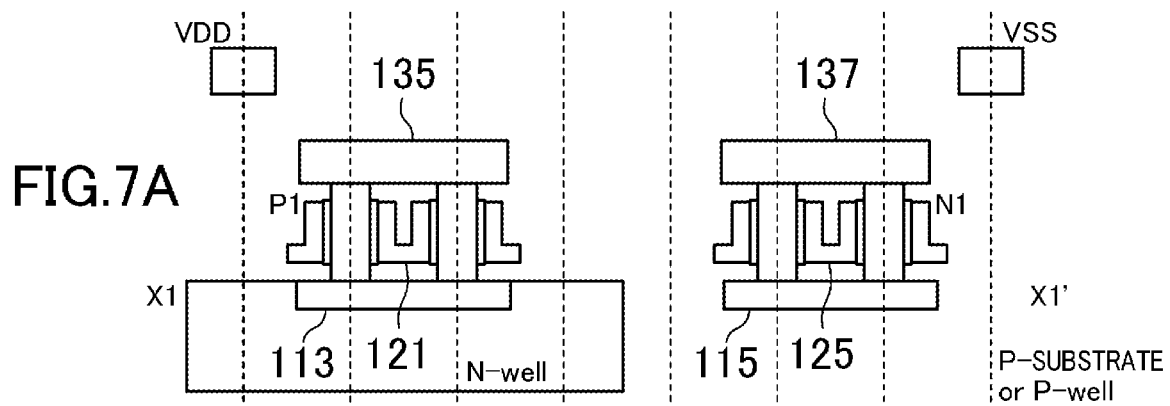
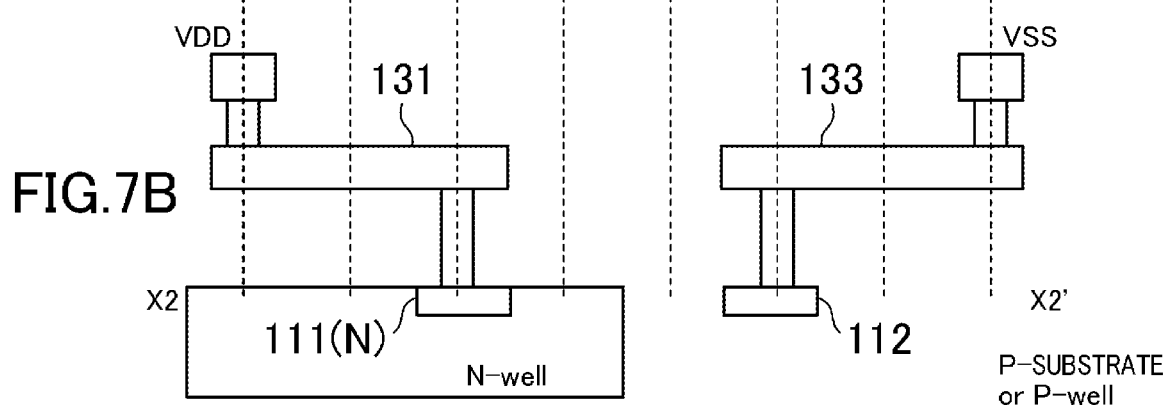
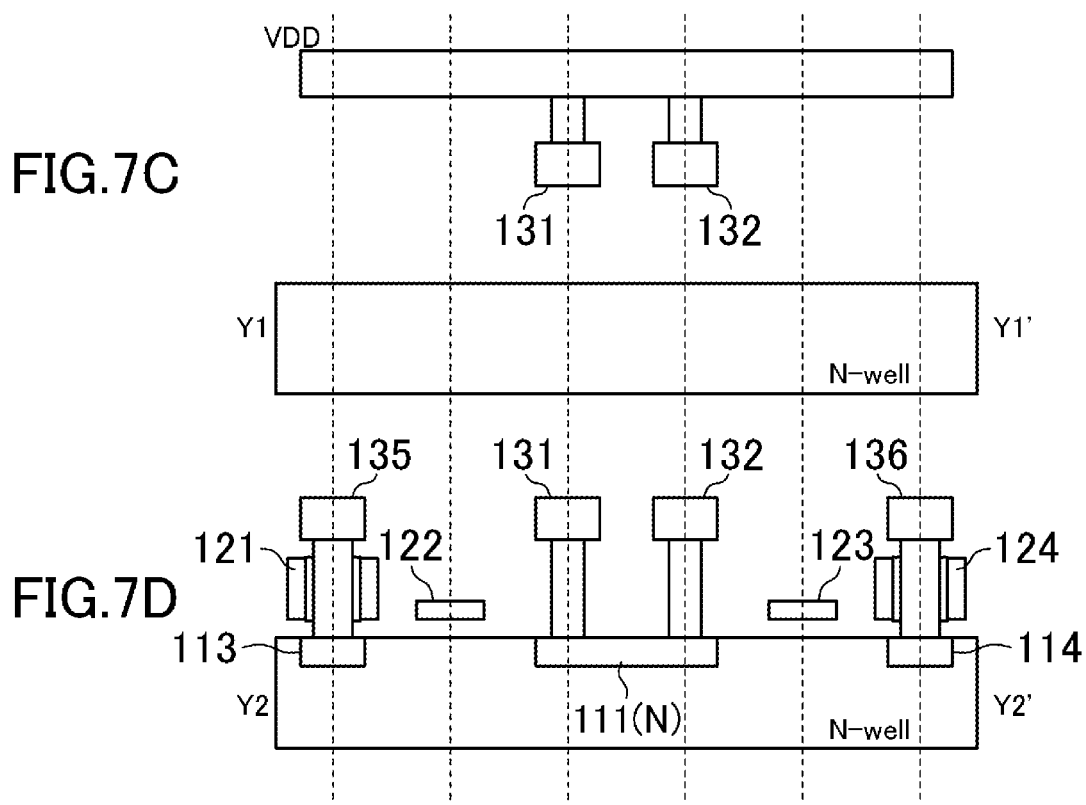

SEMICONDUCTOR INTEGRATED CIRCUIT DEVICE

CROSS-REFERENCE TO RELATED APPLICATIONS

This is a continuation of International Application No. PCT/JP2018/001655 filed on Jan. 19, 2018. The entire disclosure of this application is incorporated by reference herein.

BACKGROUND

The present disclosure relates to a semiconductor integrated circuit device provided with standard cells each including vertical nanowire (VNW) field effect transistors (FETs).

A standard cell method is known as a method of forming a semiconductor integrated circuit on a semiconductor substrate. The standard cell method is a method in which basic units (e.g., inverters, latches, flipflops, and full adders) having specific logical functions are prepared in advance as standard cells, a plurality of standard cells are placed on a semiconductor substrate, and such standard cells are connected with interconnects, thereby designing an LSI chip.

Regarding transistors as basic constituents of an LSI, improvement in integration degree, reduction in operating voltage, and improvement in operating speed have been achieved thanks to the scaling of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

U.S. Unexamined Patent Application Publication No. 2016/0063163 discloses a layout of a two-input NAND using VNW FETs. U.S. Unexamined Patent Application Publication No. 2016/0012169 discloses a layout of an inverter using VNW FETs.

SUMMARY

A semiconductor integrated circuit device includes, in some cases, a standard cell called a tap cell for supplying a potential to a well or a substrate on which transistors are formed. However, there is no disclosed prior art literature related to a tap cell in a semiconductor integrated circuit device provided with VNW FETs.

An objective of the present disclosure is providing a layout structure of a tap cell in a semiconductor integrated circuit device provided with VNW FETs.

In the first mode of the present disclosure, a semiconductor integrated circuit device provided with vertical nanowire (VNW) FETs includes a first standard cell, wherein the first standard cell includes a first power supply interconnect extending in a first direction, configured to supply a first power supply voltage, and a first bottom region of a first conductivity type formed in a top portion of a well or substrate of the first conductivity type, and the first bottom region overlaps the first power supply interconnect as viewed from top and is connected with the first power supply interconnect.

According to the above mode, in the first standard cell, the first power supply voltage is supplied from the first power supply interconnect to the well or substrate of the first conductivity type through the first bottom region of the first conductivity type. Therefore, the first standard cell functions as a tap cell.

In the second mode of the present disclosure, a semiconductor integrated circuit device provided with vertical nanowire (VNW) FETs includes a first standard cell, wherein the first standard cell includes a first power supply interconnect extending in a first direction, configured to supply a first power supply voltage, a first bottom region of a first conductivity type, formed in a top portion of a well or substrate of the first conductivity type and located away from the first power supply interconnect as viewed from top, and a first interconnect extending in a second direction perpendicular to the first direction, configured to connect the first power supply interconnect and the first bottom region.

According to the above mode, in the first standard cell, the first power supply voltage is supplied from the first power supply interconnect to the well or substrate of the first conductivity type through the first bottom region of the first conductivity type and the first interconnect. Therefore, the first standard cell functions as a tap cell.

According to the present disclosure, a tap cell can be implemented in a semiconductor integrated circuit device provided with VNW FETs.

BRIEF DESCRIPTION OF THE DRAWINGS

FIG. 1 is a plan view showing an example of the layout structure of a tap cell according to the first embodiment.

FIGS. 3A to 3C are cross-sectional views showing the layout structure of the tap cell according to the first embodiment.

FIG. 5 is a plan view showing an example of the layout structure of a tap cell according to the second embodiment.

FIGS. 6A and 6B are plan views in different layers showing the layout structure of the tap cell according to the second embodiment.

FIGS. 7A to 7D are cross-sectional views showing the layout structure of the tap cell according to the second embodiment.

FIG. 12A is a cross-sectional view and FIG. 12B is a plan view.

DETAILED DESCRIPTION

Embodiments of the present disclosure will be described hereinafter with reference to the accompanying drawings. In the following embodiments, it is assumed that a semiconductor integrated circuit device includes a plurality of standard cells, and that at least some of the plurality of standard cells include so-called vertical nanowire FETs (VNW FETs). It is also assumed that the plurality of standard cells include a tap cell.

Figure 12A:
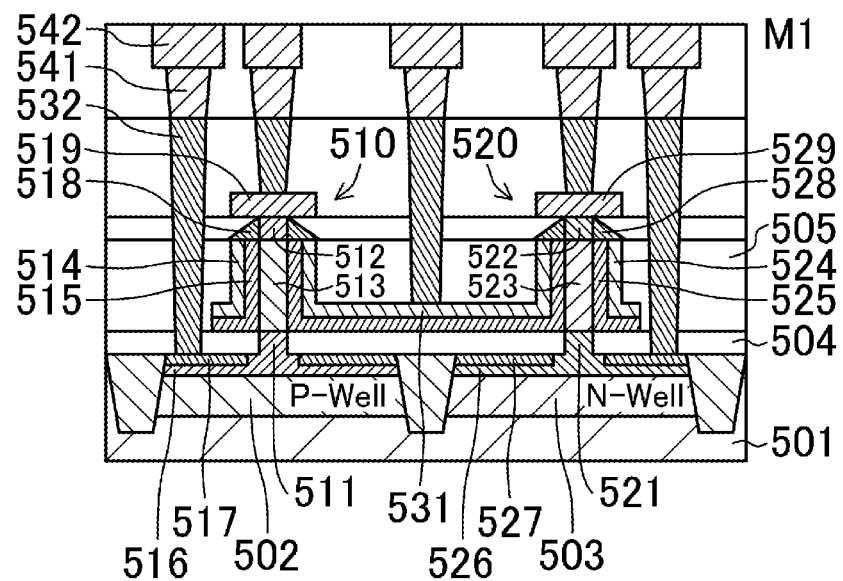
FIGS. 12A and 12B are schematic views showing a basic structure example of vertical nanowire FETs, where
Figure 12B:
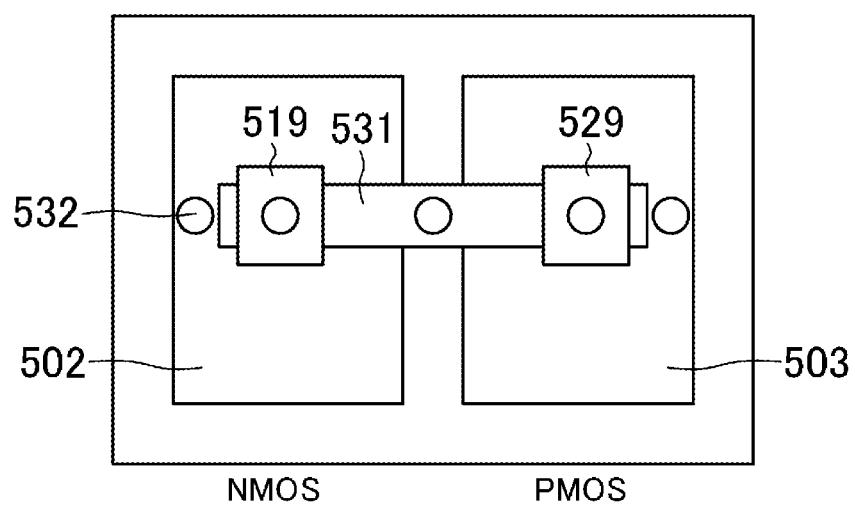

FIGS. 12A and 12B are schematic views showing a basic structure example of VNW FETs, where FIG. 12A is a cross-sectional view and FIG. 12B is a plan view. Note that, in FIG. 12B, illustration of metal interconnects is omitted and, for easy understanding, constituents invisible when actually viewed from top are illustrated.

As shown in FIGS. 12A and 12B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 12A and 12B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, $BF_2$, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 13A:
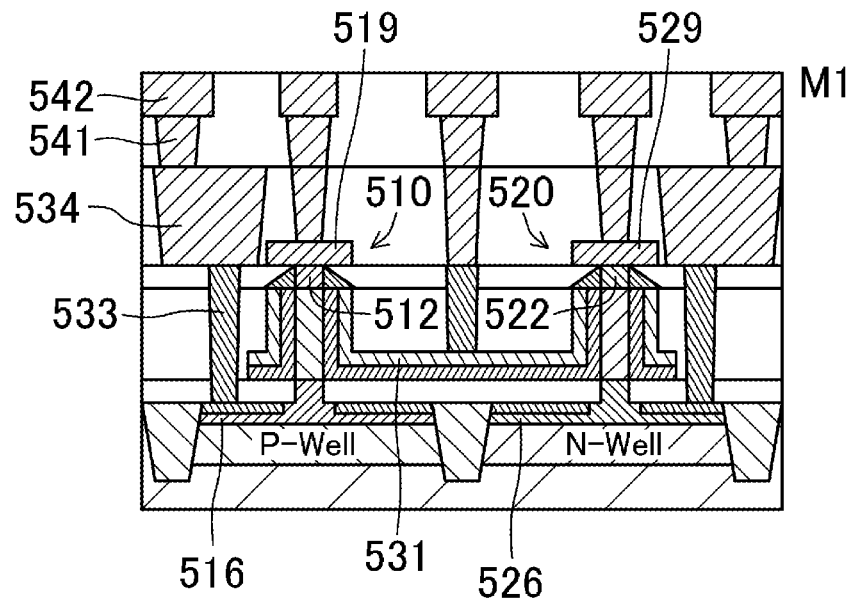
FIGS. 13A and 13B are schematic cross-sectional views showing basic structure examples of vertical nanowire FETs in which local interconnects are used.
Figure 13B:
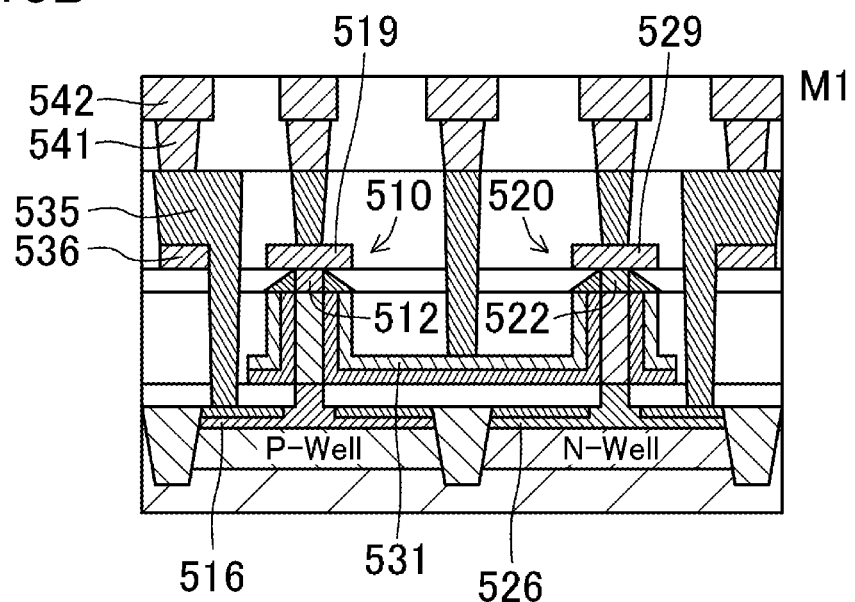

FIGS. 13A and 13B show basic structure examples of VNW FETs in which local interconnects are used. In FIG. 13A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, the local interconnects 534, and the contacts 541. The silicide regions 519 and 529 are individually connected to the interconnects 542 formed in the metal interconnect layer M1 via the local interconnects 534 and the contacts 541.

In FIG. 13B, local interconnects 535 are formed between the metal interconnect layer M1 and the bottom regions 516 and 526. In other words, the local interconnect 535 corresponds to an integrated form of the contact 533 and the local interconnect 534 in FIG. 13A. Silicide regions 536 are used as an etching stopper in the process of forming the local interconnects 535.

As used herein, a VNW FET that contributes to the logical function of the standard cell is called an "active VNW FET," and a VNW FET that does not contribute to the logical function of the standard cell is called a "dummy VNW FET." In the following description, the bottom electrode, top electrode, and gate electrode of a VNW FET are simply referred to as the bottom, the top, and the gate, respectively, as appropriate. Also, when one or a plurality of configuration units each constituted by a vertical nanowire, a top, a bottom, and a gate constitute one VNW FET, this configuration unit is simply referred to as a "VNW" to distinguish this from the VNW FET. The standard cell is simply referred to as a cell as appropriate.

Also, like the tap cell according to the present disclosure, in some cases, a VNW does not constitute a transistor due to a difference in the polarity of the bottom. As used herein, a structure that is similar to the structure of a VNW FET but does not constitute a transistor is called a "pseudo VNW FET" or a "pseudo transistor."

As used herein, an expression indicating that widths, etc. are the same, like the "same interconnect width" should be understood as including a range of fabrication variations.

First Embodiment

Figure 2A:
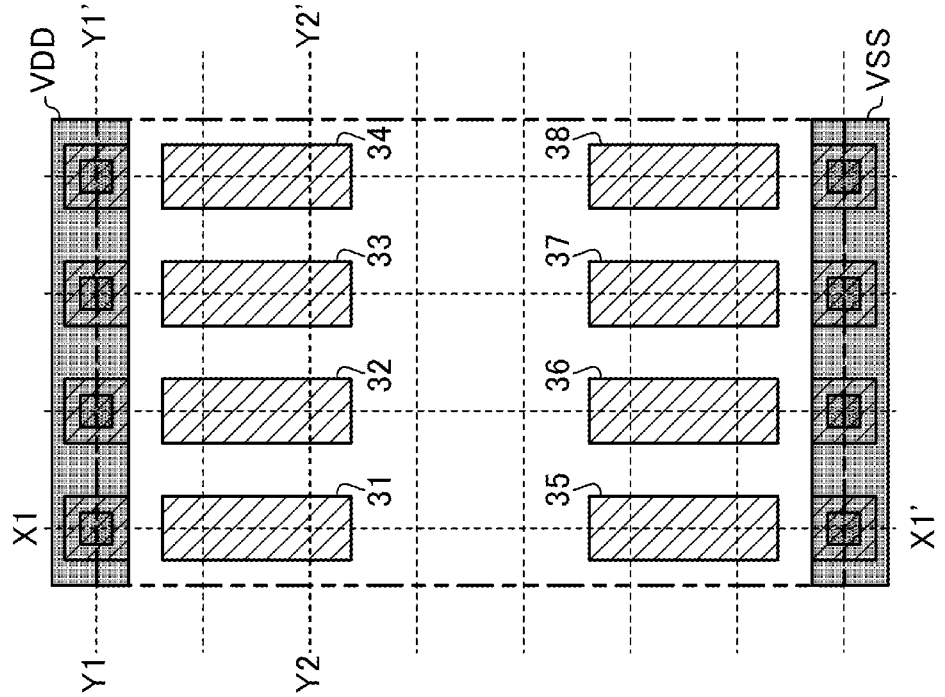
FIGS. 2A and 2B are plan views in different layers showing the layout structure of the tap cell according to the first embodiment.
Figure 2B:
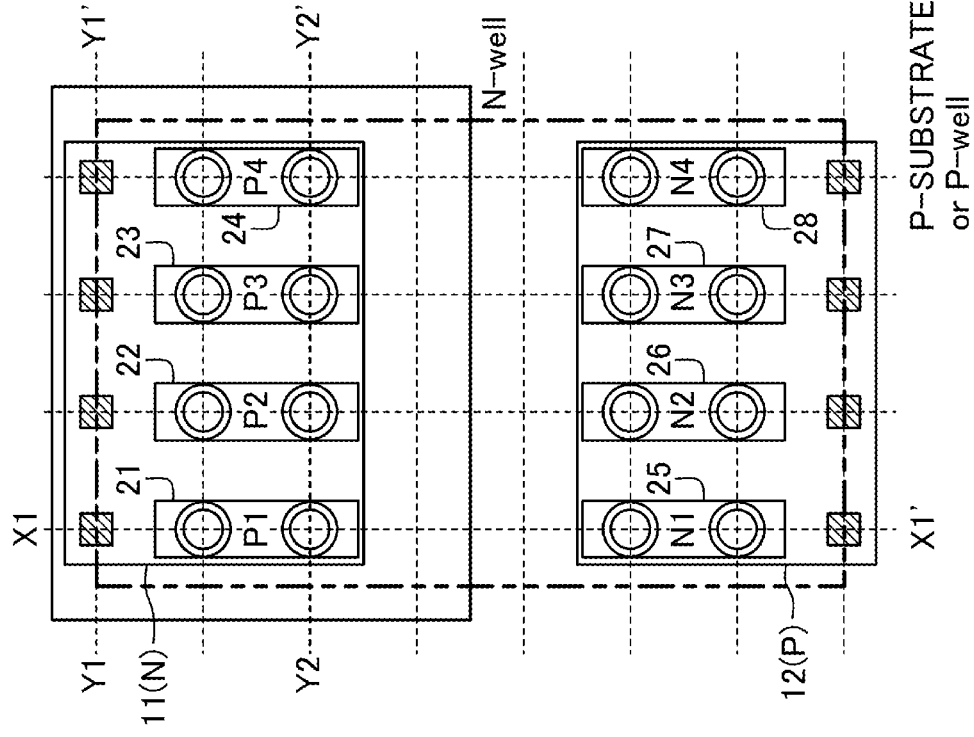

FIGS. 1, 2A-2B, and 3A-3C are views showing an example of the layout structure of a tap cell according to the first embodiment, where FIG. 1 is a plan view, FIGS. 2A and 2B are plan views in different layers, and FIGS. 3A to 3C are cross-sectional views. Specifically, FIG. 2A shows VNWs and layers below them, and FIG. 2B shows layers above the VNWs. FIG. 3A is a cross-sectional view in the vertical direction as viewed from top in FIG. 1 and FIGS. 3B and 3C are cross-sectional views in the horizontal direction as viewed from top in FIG. 1, where FIG. 3A shows a cross section taken along line X1-X1', FIG. 3B shows a cross section taken along line Y1-Y1', and FIG. 3C shows a cross section taken along line Y2-Y2'.

Note that, in the following description, in the plan views such as FIG. 1, the horizontal direction as viewed from the figure is referred to as the X direction (corresponding to the first direction) and the vertical direction is referred to as the Y direction (corresponding to the second direction). Also, the dashed lines running vertically and horizontally in the plan views such as FIG. 1 and the dashed lines running vertically in the cross-sectional views such as FIGS. 3A-3C represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs or pseudo VNW FETs and grid lines for M1 interconnects may be arranged at different spacing from each other. Further, the components may not necessarily be placed on grid lines. It is however preferable to place the components on grid lines from the standpoint of preventing or reducing fabrication variations.

The device structure of this embodiment is based on the structure of FIG. 13A, although it can be a structure based on the structure of FIG. 12 or FIG. 13B, or based on any other device structure. This also applies to the subsequent embodiments. Also, for easy understanding of the figures, illustration of the STIs, the insulating films, the silicide layers on the bottoms, the silicide layers on the tops, and the sidewalls of the tops is omitted. This also applies to the subsequent drawings.

As shown in FIGS. 1, 2A-2B, and 3A-3C, power supply interconnects VDD and VSS extending in the X direction are respectively provided on the top and bottom (both ends in the Y direction) of the cell. Note that VDD and VSS are used as symbols indicating both the power supply interconnects and the power supply voltages supplied through the power supply interconnects. The power supply interconnects VDD and VSS are formed in an M1 interconnect layer. The power supply interconnects VDD and VSS can be shared by cells upwardly or downwardly adjacent to the interconnects. It is however acceptable to adopt a layout in which the power supply interconnects are not shared by cells upwardly or downwardly adjacent to the interconnects.

A p-type transistor region (shown as Pch, which also applies to the subsequent plan views) and an n-type transistor region (shown as Nch, which also applies to the subsequent plan views) are formed between the power supply interconnects VDD and VSS. The p-type transistor region is provided on the side closer to the power supply interconnect VDD and the n-type transistor region is provided on the side closer to the power supply interconnect VSS. In the tap cell according to the present disclosure, pseudo transistors (pseudo VNW FETs) are formed in the p-type transistor region and the n-type transistor region.

The p-type transistor region lies on an n-well, and a bottom region 11 doped to have n-type conductivity is formed in a top portion of the n-well. The bottom region 11 spreads over to a range overlapping the power supply interconnect VDD as viewed from top. The bottom region 11 is connected with the power supply interconnect VDD through local interconnects and vias, to receive the power supply voltage VDD. That is, the power supply voltage VDD is supplied to the n-well through the bottom region 11.

The n-type transistor region lies on a p-substrate or a p-well, and a bottom region 12 doped to have p-type conductivity is formed in a top portion of the p-substrate or the p-well. The bottom region 12 spreads over to a range overlapping the power supply interconnect VSS as viewed from top. The bottom region 12 is connected with the power supply interconnect VSS through local interconnects and vias, to receive the power supply voltage VSS. That is, the power supply voltage VSS is supplied to the p-substrate or the p-well through the bottom region 12. In the illustrated example, the bottom region 11 and the bottom region 12 are the same in position and size in the X direction.

In the p-type transistor region, pseudo transistors P1, P2, P3, and P4 are arranged in the X direction. The pseudo transistors P1, P2, P3, and P4 each have two VNWs lying side by side in the Y direction. In the n-type transistor region, pseudo transistors N1, N2, N3, and N4 are arranged in the X direction. The pseudo transistors N1, N2, N3, and N4 each have two VNWs lying side by side in the Y direction.

The bottoms of the pseudo transistors P1, P2, P3, and P4 are connected to the bottom region 11. The gates of the pseudo transistors P1, P2, P3, and P4 are respectively connected to gate interconnects 21, 22, 23, and 24 extending in parallel in the Y direction, and the tops thereof are respectively connected to local interconnects 31, 32, 33, and 34 extending in parallel in the Y direction.

The bottoms of the pseudo transistors N1, N2, N3, and N4 are connected to the bottom region 12. The gates of the pseudo transistors N1, N2, N3, and N4 are respectively connected to gate interconnects 25, 26, 27, and 28 extending in parallel in the Y direction, and the tops thereof are respectively connected to local interconnects 35, 36, 37, and 38 extending in parallel in the Y direction.

The tops of the pseudo transistors P1, P2, P3, and P4 and pseudo transistors N1, N2, N3, and N4 may be doped to have n-type conductivity or p-type conductivity. The gate interconnects 21, 22, 23, 24, 25, 26, 27, and 28 and the local interconnects 31, 32, 33, 34, 35, 36, 37, and 38 are floating. That is, the gates and tops of the pseudo transistors P1, P2, P3, and P4 and pseudo transistors N1, N2, N3, and N4 are floating.

With the layout structure as described above, functions and effects as follows are obtained.

In the p-type transistor region, the power supply voltage VDD is supplied from the power supply interconnect VDD to the n-well through the bottom region 11. Also, in the n-type transistor region, the power supply voltage VSS is supplied from the power supply interconnect VSS to the p-substrate or the p-well through the bottom region 12. Therefore, the cell according to this embodiment functions as a tap cell.

In the tap cell according to this embodiment, the pseudo transistors P1 to P4 and N1 to N4 are placed. This makes the distribution of VNWs uniform in the semiconductor integrated circuit device, increasing the fabrication precision and also preventing or reducing variations in transistor characteristics. Moreover, for cells placed on both sides of the tap cell, the predictability of transistor characteristics improves.

The gate interconnects 21, 22, 23, 24, 25, 26, 27, and 28 all extend in the Y direction and have the same interconnect width. This makes fabrication easy and increases the fabrication precision. The local interconnects 31, 32, 33, 34, 35, 36, 37, and 38 all extend in the Y direction and have the same interconnect width. This makes fabrication easy and increases the fabrication precision.

At least some of the gates and tops of the pseudo transistors P1, P2, P3, and P4 and pseudo transistors N1, N2, N3, and N4 may not be floating. For example, the power supply voltage VDD may be supplied to the gates and tops of the pseudo transistors P1, P2, P3, and P4.

The gates of pseudo transistors lying side by side in the Y direction may be mutually connected. For example, the gate of the pseudo transistor P1 and the gate of the pseudo transistor N1 may be connected through a single gate interconnect.

Some or all of the VNWs may be omitted. For example, out of the two VNWs each of the pseudo transistors P2, P3, N2, and N3, the VNW located closer to the center of the tap cell may be omitted. In this case, the influence on the surrounding cells will be small. Some or all of the gate interconnects 21, 22, 23, 24, 25, 26, 27, and 28 and the local interconnects 31, 32, 33, 34, 35, 36, 37, and 38 may be omitted.

In the layout structure described above, the bottom region 11 is formed integrally over the entire region of the pseudo transistors P1 to P4, and the bottom region 12 is formed integrally over the entire region of the pseudo transistors N1 to N4. Alternatively, the bottom regions 11 and 12 may be formed in separate forms. For example, the bottom region 11 may be divided for the pseudo transistors P1 to P4 to form individual long regions in the Y direction.

In the layout structure described above, the description was made taking as an example a tap cell having four pseudo transistors arranged in the X direction and having a cell width (size in the X direction) of four grids. The cell width of the tap cell is not limited to this. Also, at layout design, a plurality of tap cells different in cell width may be prepared. This will improve the degree of freedom of the layout design.

<Block Layout Example>

Figure 4:
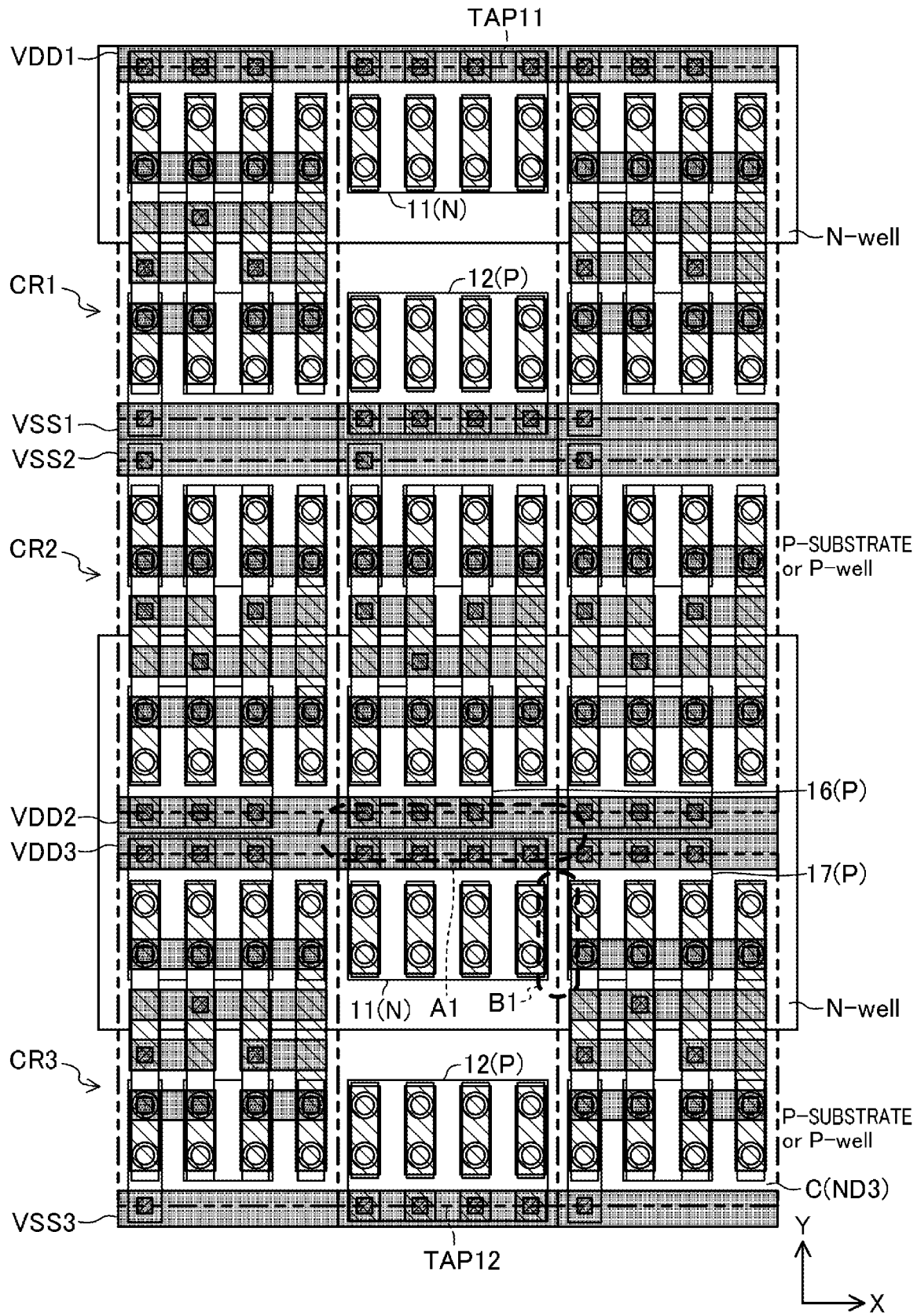
FIG. 4 is a plan view showing an example of the layout of a circuit block using tap cells according to the first embodiment.

FIG. 4 is a plan view showing an example of the layout of a circuit block using the tap cell according to the first embodiment. In the circuit block shown in FIG. 4, a plurality of cell rows CR1, CR2, and CR3 each having a plurality of cells C lining up in the X direction are arranged in the Y direction. Among the plurality of cells C, TAP11 and TAP12 are tap cells and have the layout structure described above. The other cells C (three-input NAND cells ND3 in the example of FIG. 4) have a layout structure including VNW FETs. Power supply interconnects VDD1 and VSS1 extending in the X direction are placed on both sides of the cell row CR1 in the Y direction. Power supply interconnects VSS2 and VDD2 extending in the X direction are placed on both sides of the cell row CR2 in the Y direction. Power supply interconnects VDD3 and VSS3 extending in the X direction are placed on both sides of the cell row CR3 in the Y direction. The power supply interconnects VSS1, VSS2, and VSS3 supply the power supply voltage VSS, and the power supply interconnects VDD1, VDD2, VDD3 supply the power supply voltage VDD.

In the circuit block shown in FIG. 4, the plurality of cell rows CR1, CR2, and CR3 are vertically flipped alternately, so that the cell rows CR1 and CR2 share a p-substrate or a p-well, and the cell rows CR2 and CR3 share an n-well. The tap cells are placed every other cell row. In FIG. 4, the tap cell TAP11 is placed in the cell row CR1, and the tap cell TAP12 is placed in the cell row CR3. No tap cell is placed in the cell row CR2.

On the p-substrate or the p-well shared by the cell rows CR1 and CR2, n-type VNW FETs are formed in the cells C, and the power supply voltage VSS is supplied to the p-substrate or the p-well through the p-type bottom region 12 of the tap cell TAP11. Also, on the n-well shared by the cell rows CR2 and CR3, p-type VNW FETs are formed in the cells C, and the power supply voltage VDD is supplied to the n-well through the n-type bottom region 11 of the tap cell TAP12.

As is found from FIG. 4, by placing VNWs in the tap cells TAP11 and TAP12, the placement of VNWs is made regular in the block layout. This prevents or decreases fabrication variations and improves the yield. Also, the characteristics of VNW FETs placed in the other cells C, in particular, VNW FETs placed on the left, right, top, and bottom sides of the tap cells are predictable.

Note that, in the block layout of FIG. 4, vertically adjacent cell rows do not share the power supply interconnect lying between them. This is because the conductivity polarities of the bottom regions placed under the power supply interconnects are different between the tap cells and the other cells. Alternatively, the layout may be made so that vertically adjacent cell rows share the power supply interconnect between them. In this case, for a portion under the power supply interconnect in which the bottom regions overlap between a tap cell and any of the other cells, the conductivity polarity of the bottom region of the other cell may be used. With this, the block area can be made smaller.

Second Embodiment

FIGS. 5, 6A-6B, and 7A-7D are views showing an example of the layout structure of a tap cell according to the second embodiment, where FIG. 5 is a plan view, FIGS. 6A and 6B are plan views in different layers, and FIGS. 7A to 7D are cross-sectional views. Specifically, FIG. 6A shows VNWs and layers below them, and FIG. 6B shows layers above the VNWs. FIGS. 7A and 7B are cross-sectional views in the vertical direction as viewed from top in FIG. 5 and FIGS. 7C and 7D are cross-sectional views in the horizontal direction as viewed from top in FIG. 5, where FIG. 7A shows a cross section taken along line X1-X1', FIG. 7B shows a cross section taken along line X2-X2', FIG. 7C shows a cross section taken along line Y1-Y1', and FIG. 7D shows a cross section taken along line Y2-Y2'.

In the block layout of FIG. 4 described in the first embodiment, the spacing between a p-type bottom region and an n-type bottom region is very narrow in some portions, making the pattern formation difficult in some cases. For example, in portion A1 in FIG. 4, the spacing between the n-type bottom region 11 of the tap cell TAP12 and a p-type bottom region 16 of the cell C lying on the upper side thereof as viewed from the figure is very narrow. Also, in portion B1, the spacing between the n-type bottom region 11 of the tap cell TAP12 and a p-type bottom region 17 of the cell C lying on the right side thereof as viewed from the figure is very narrow. The tap cell according to this embodiment can solve this problem.

As shown in FIGS. 5, 6A-6B, and 7A-7D, a p-type transistor region lies on an n-well, and a bottom region 111 doped to have n-type conductivity is formed in a top portion of the n-well. The bottom region 111 is apart from the power supply interconnect VDD as viewed from top. The bottom region 111 is connected with the power supply interconnect VDD through local interconnects 131 and 132 as examples of interconnects extending in parallel in the Y direction, to receive the power supply voltage VDD. That is, the power supply voltage VDD is supplied to the n-well through the bottom region 111.

An n-type transistor region lies on a p-substrate or a p-well, and a bottom region 112 doped to have p-type conductivity is formed in a top portion of the p-substrate or the p-well. The bottom region 112 is apart from the power supply interconnect VSS as viewed from top. The bottom region 112 is connected with the power supply interconnect VSS through local interconnects 133 and 134 as examples of interconnects extending in parallel in the Y direction, to receive the power supply voltage VSS. That is, the power supply voltage VSS is supplied to the p-substrate or p-well through the bottom region 112.

In the p-type transistor region, transistors P1 and P2 are placed on both sides of the bottom region 111 in the X direction. The transistors P1 and P2 each have two VNWs lying side by side in the Y direction. Also, in the n-type transistor region, transistors N1 and N2 are placed on both sides of the bottom region 112 in the X direction. The transistors N1 and N2 each have two VNWs lying side by side in the Y direction.

The bottoms of the transistors P1 and P2 are respectively connected to p-type bottom regions 113 and 114, the gates thereof are respectively connected to gate interconnects 121 and 124 extending in the Y direction, and the tops thereof are respectively connected to local interconnects 135 and 136 extending in the Y direction. The bottoms of the transistors N1 and N2 are respectively connected to n-type bottom regions 115 and 116, the gates thereof are respectively connected to gate interconnects 125 and 128 extending in the Y direction, and the tops thereof are respectively connected to local interconnects 137 and 138 extending in the Y direction. The tops of the transistors P1 and P2 are doped to have p-type conductivity, and the tops of the transistors N1 and N2 are doped to have n-type conductivity. The transistors P1, P2, N1, and N2 are dummy VNW FETs.

Gate interconnects 122 and 123 extending in the Y direction are respectively formed between the bottom region 111 and the transistor P1 and between the bottom region 111 and the transistor P2. Also, gate interconnects 126 and 127 extending in the Y direction are respectively formed between the bottom region 112 and the transistor N1 and between the bottom region 112 and the transistor N2.

The bottom regions 113, 114, 115, and 116, the gate interconnects 121, 124, 125, and 128, and the local interconnects 135, 136, 137, and 138 are floating. That is, the bottoms, gates, and tops of the transistors P1, P2, N1, and N2 are floating. The gate interconnects 122, 123, 126, and 127 are also floating.

With the layout structure as described above, functions and effects as follows are obtained.

In the p-type transistor region, the power supply voltage VDD is supplied from the power supply interconnect VDD to the n-well through the local interconnects 131 and 132 and the bottom region 111. Also, in the n-type transistor region, the power supply voltage VSS is supplied from the power supply interconnect VSS to the p-substrate or the p-well through the local interconnects 133 and 134 and the bottom region 112. Therefore, the cell according to this embodiment functions as a tap cell.

The bottom region 111 is apart from the power supply interconnect VDD as viewed from top, and the bottom region 112 is apart from the power supply interconnect VSS as viewed from top. Therefore, in the case of placing any of the other cells on the top and bottom (both sides in the Y direction) of the tap cell, it is possible to place a p-type bottom region under the power supply interconnect VDD and place an n-type bottom region under the power supply interconnect VSS. Thus, since the tap cell according to this embodiment can share the power supply interconnects VDD and VSS with vertically adjacent ones of the other cells, the area of the circuit block can be made smaller.

The n-type bottom region 111 is sufficiently spaced in the X direction from the p-type bottom regions 113 and 114 with which the bottoms of the transistors P1 and P2 are connected, and also sufficiently spaced in the Y direction from a p-type bottom region placed under the power supply interconnect VDD in a cell placed adjacently. Likewise, the p-type bottom region 112 is sufficiently spaced in the X direction from the n-type bottom regions 115 and 116 with which the bottoms of the transistors N1 and N2 are connected, and also sufficiently spaced in the Y direction from an n-type bottom region placed under the power supply interconnect VSS in a cell placed adjacently.

In the tap cell according to this embodiment, the transistors P1, P2, N1, and N2 are placed. This makes the distribution of VNWs uniform in the semiconductor integrated circuit device, increasing the fabrication precision and also preventing or reducing variations in transistor characteristics. Moreover, for cells adjacently placed on both sides of the tap cell, the predictability of transistor characteristics improves.

The gate interconnects 121, 122, 123, 124, 125, 126, 127, and 128 all extend in the Y direction and have the same interconnect width. This makes fabrication easy and increases the fabrication precision. The local interconnects 131, 132, 133, 134, 135, 136, 137, and 138 all extend in the Y direction and have the same interconnect width. This makes fabrication easy and increases the fabrication precision.

At least some of the bottoms, gates, and tops of the transistors P1, P2, N1, and N2 may not be floating. For example, the power supply voltage VDD may be supplied to the bottoms, gates, and tops of the transistors P1 and P2.

The gates of the transistors lying side by side in the Y direction may be mutually connected. For example, the gate of the transistor P1 and the gate of the transistor N1 may be connected through a single gate interconnect. Also, the tops of the transistors lying side by side in the Y direction may be mutually connected. For example, the top of the transistor P1 and the top of the transistor N1 may be connected through a single local interconnect. Also, the gate interconnects lying side by side in the Y direction in a portion in which no VNW is formed may be mutually connected. For example, the gate interconnects 122 and 126 may be connected together to form a single gate interconnect.

Some or all of the VNWs in the transistors P1, P2, N1, and N2 may be omitted.

<Block Layout Example>

Figure 8:
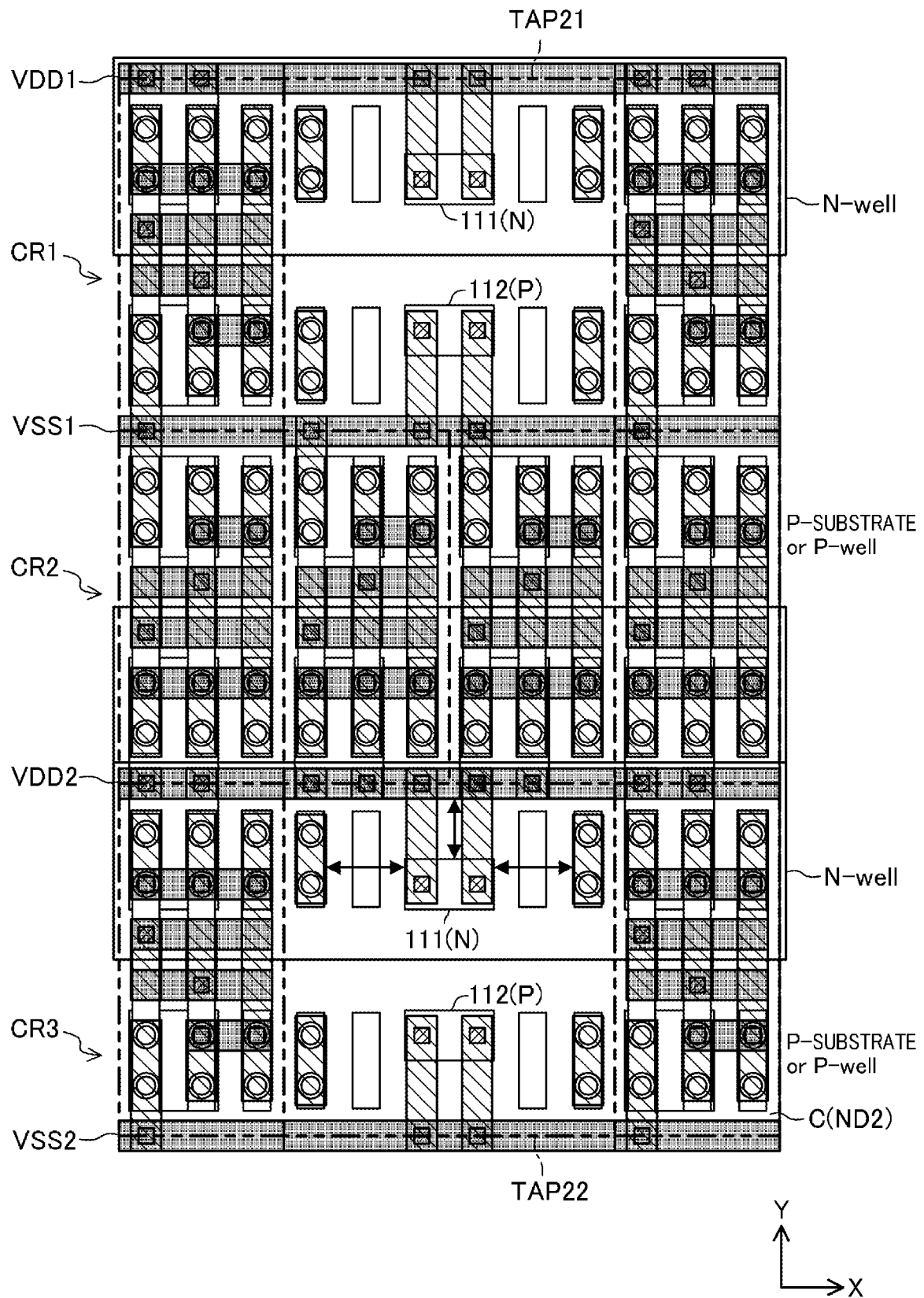
FIG. 8 is a plan view showing an example of the layout of a circuit block using tap cells according to the second embodiment.

FIG. 8 is a plan view showing an example of the layout of a circuit block using the tap cells according to the second embodiment. In the circuit block shown in FIG. 8, a plurality of cell rows CR1, CR2, and CR3 each having a plurality of cells C lining up in the X direction are arranged in the Y direction. Among the plurality of cells C, TAP21 and TAP22 are tap cells and have the layout structure described above. The other cells C (two-input NAND cells ND2 in the example in FIG. 8) have a layout structure including VNW FETs. Power supply interconnects VDD1, VSS1, VDD2, and VSS2 extending in the X direction are placed on both sides of the cell rows CR1, CR2, and CR3 in the Y direction. The power supply interconnects VSS1 and VSS2 supply the power supply voltage VSS, and the power supply interconnects VDD1 and VDD2 supply the power supply voltage VDD.

In the circuit block shown in FIG. 8, the plurality of cell rows CR1, CR2, and CR3 are vertically flipped alternately, so that the adjacent cell rows share the power supply interconnect between them. For example, the cell rows CR1 and CR2 share the power supply interconnect VS S1, and the cell rows CR2 and CR3 share the power supply interconnect VDD2. Also, the cell rows CR1 and CR2 share a p-substrate or a p-well, and the cell rows CR2 and CR3 share an n-well. The tap cells are placed every other cell row. In FIG. 8, the tap cell TAP21 is placed in the cell row CR1, and the tap cell TAP22 is placed in the cell row CR3. No tap cell is placed in the cell row CR2.

On the p-substrate or the p-well shared by the cell rows CR1 and CR2, n-type VNW FETs are formed in the cells C, and the power supply voltage VSS is supplied to the p-substrate or the p-well through the p-type bottom region 112 of the tap cell TAP21. Also, on the n-well shared by the cell rows CR2 and CR3, p-type VNW FETs are formed in the cells C, and the power supply voltage VDD is supplied to the n-well through the n-type bottom region 111 of the tap cell TAP22.

As is found from FIG. 8, in this embodiment, since the power supply interconnects can be shared by vertically adjacent cell rows, the area of the circuit block is smaller. Also, since VNWs are placed at positions closer to both ends in the X direction in the tap cells TAP21 and TAP22, the characteristics of VNW FETs placed in the other cells C, in particular, VNW FETs in cells placed on the left and right sides of the tap cells are predictable.

The bottom regions of the tap cells are sufficiently spaced from bottom regions of a different conductivity type in the X and Y directions. For example, in FIG. 8, the spacing of the n-type bottom region 111 of the tap cell TAP22 from p-type bottom regions is as shown by the arrows. This makes the pattern formation easy.

Third Embodiment

Figure 9:
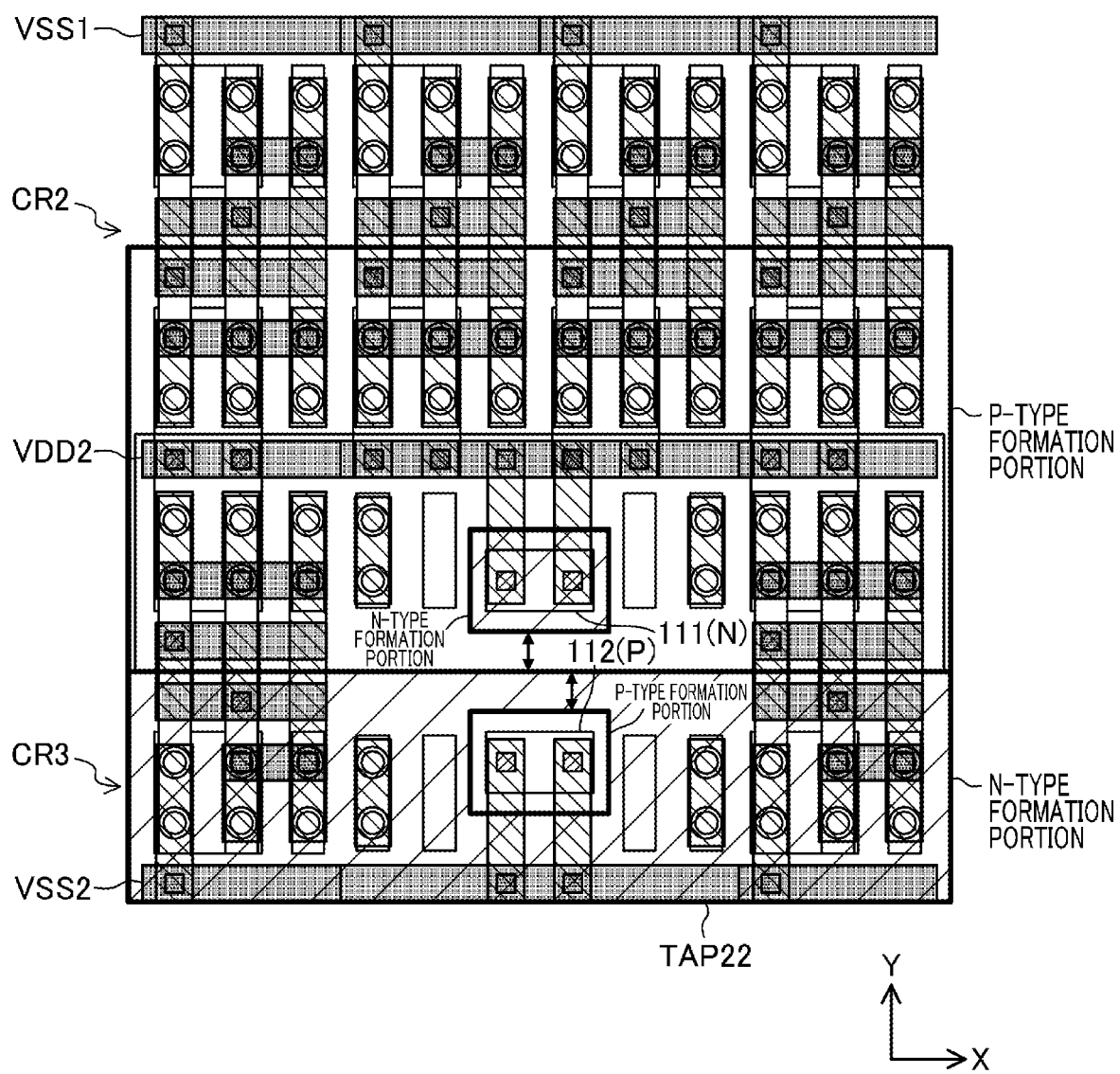
FIG. 9 is a partial enlarged view of FIG. 8.

FIG. 9 is an enlarged view of a lower part of FIG. 8. In FIG. 9, a p-type formation portion refers to a range in which p-type bottom regions are patterned, and an n-type formation portion refers to a range in which n-type bottom regions are patterned. As is found from FIG. 9, an n-type formation portion for forming the n-type bottom region 111 in the tap cell TAP22 lies like an island in a broad p-type formation portion. Also, a p-type formation portion for forming the p-type bottom region 112 in the tap cell TAP22 lies like an island in a broad n-type formation portion. In such placement, narrow portions (portions shown by the arrows in FIG. 9) appear in the p-type formation portion and the n-type formation portion, making the pattern formation difficult. The pattern formation is also made difficult since the n-type formation portion for forming the n-type bottom region 111 and the p-type formation portion for forming the p-type bottom region 112 themselves are small. In this embodiment, by solving the above problem, a layout structure of a tap cell that makes the pattern formation easy is provided.

Figure 10:
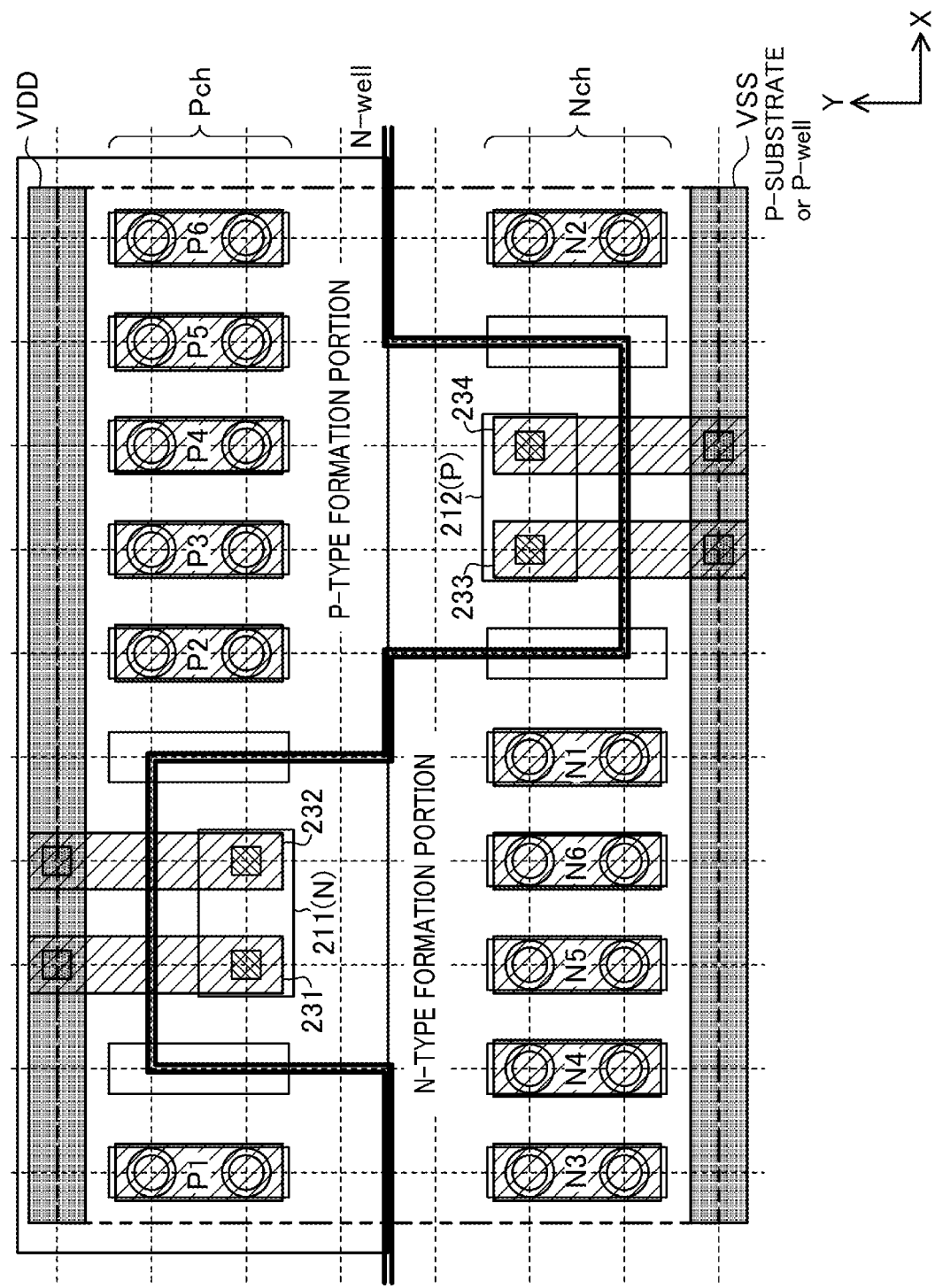
FIG. 10 is a plan view showing an example of the layout structure of a tap cell according to the third embodiment.

FIG. 10 is a plan view showing an example of the layout structure of a tap cell according to the third embodiment. The layout structure of FIG. 10 has a configuration in which the position of the bottom region 112 with respect to the bottom region 111 in the layout structure of FIG. 5 is displaced by four grids in the X direction.

As shown in FIG. 10, a p-type transistor region lies on an n-well, and a bottom region 211 doped to have n-type conductivity is formed in a top portion of the n-well. The bottom region 211 is apart from the power supply interconnect VDD as viewed from top. The bottom region 211 is connected with the power supply interconnect VDD through local interconnects 231 and 232 as examples of interconnects extending in parallel in the Y direction, to receive the power supply voltage VDD. That is, the power supply voltage VDD is supplied to the n-well through the bottom region 211.

An n-type transistor region lies on a p-substrate or a p-well, and a bottom region 212 doped to have p-type conductivity is formed in a top portion of the p-substrate or the p-well. The bottom region 212 is apart from the power supply interconnect VSS as viewed from top. The bottom region 212 is connected with the power supply interconnect VSS through local interconnects 233 and 234 as examples of interconnects extending in parallel in the Y direction, to receive the power supply voltage VSS. That is, the power supply voltage VSS is supplied to the p-substrate or the p-well through the bottom region 212.

The bottom region 211 and the bottom region 212 are displaced from each other by four grids in the X direction, located at positions having no overlap between them in the X direction.

In the p-type transistor region, transistors P1 and P2 are placed on both sides of the bottom region 211 in the X direction. Also, transistors P3, P4, P5, and P6 are placed on the right side of the transistor P2 as viewed from the figure. The transistors P1 to P6 each have two VNWs lying side by side in the Y direction. Likewise, in the n-type transistor region, transistors N1 and N2 are placed on both sides of the bottom region 212 in the X direction. Also, transistors N3, N4, N5, and N6 are placed on the left side of the transistor N1 as viewed from the figure. The transistors N1 to N6 each have two VNWs lying side by side in the Y direction.

In the layout structure of FIG. 10, an n-type formation portion for forming the n-type bottom region 211 is joined with an n-type formation portion in the n-type transistor region. Also, a p-type formation portion for forming the p-type bottom region 212 is joined with a p-type formation portion in the p-type transistor region. Therefore, there is no small p-type formation portion lying like an island in the broad n-type formation portion, and no small n-type formation portion lying like an island in the broad p-type formation portion. Also, no narrow portion appears in the p-type formation portion nor the n-type formation portion. This makes the pattern formation easy.

In the layout structure of FIG. 10, the bottom region 211 and the bottom region 212 are displaced from each other by four grids in the X direction. The length of the displacement is not limited to this, but the bottom regions may just be displaced so that no narrow portion appear in the p-type formation portion nor the n-type formation portion.

Figure 11:
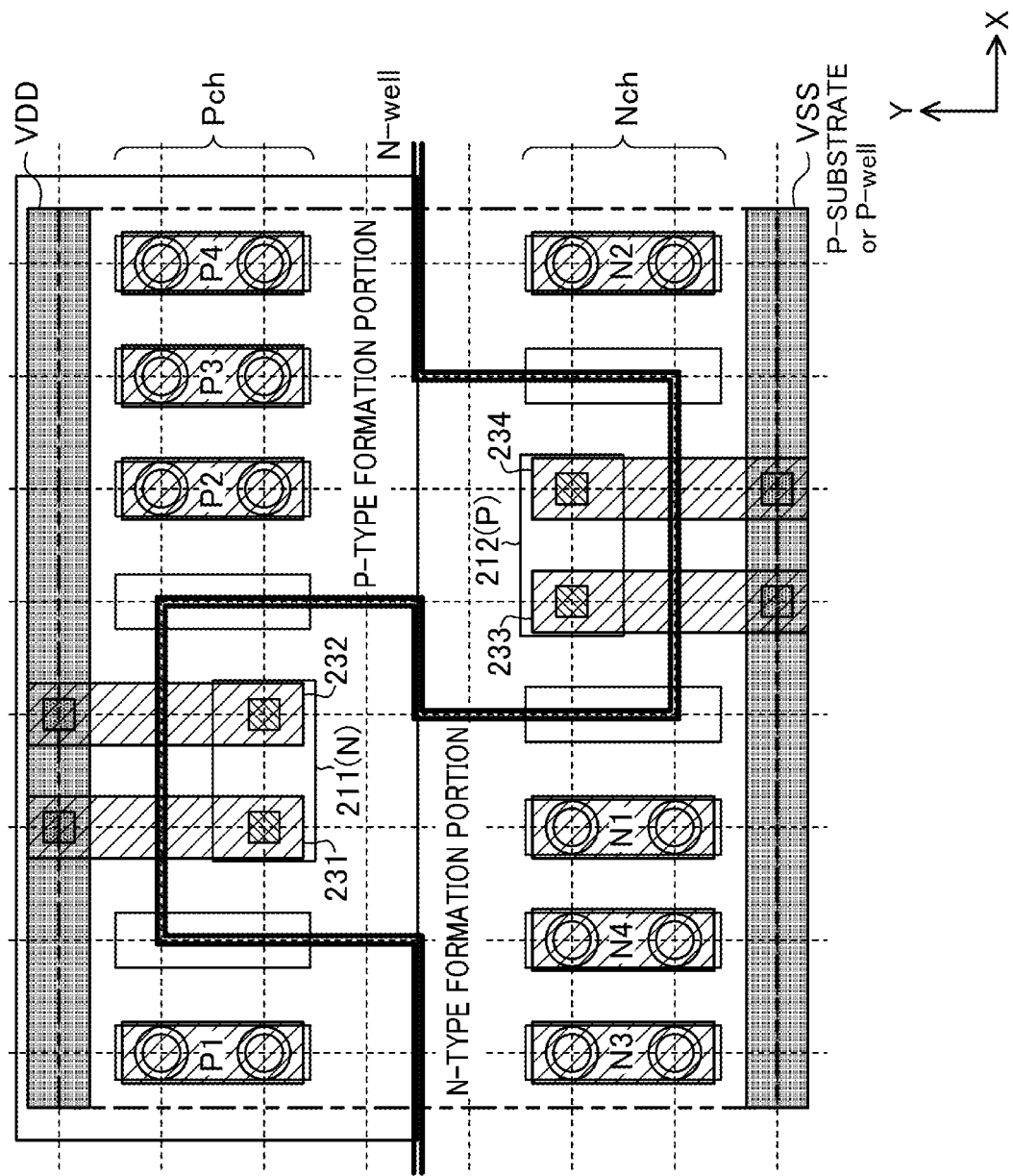
FIG. 11 is a plan view showing an example of the layout structure of a tap cell according to an alteration of the third embodiment.

FIG. 11 is a plan view showing an example of the layout structure of a tap cell according to an alteration of this embodiment. The layout structure of FIG. 11 has a configuration in which the positions of the bottom region 211 and bottom region 212 are displaced from each other by two grids in the X direction. The bottom regions 211 and 212 are placed at positions having no overlap between them in the X direction. In the layout structure of FIG. 11, also, there is no small p-type formation portion lying like an island in the n-type formation portion, and there is no small n-type formation portion lying like an island in the p-type formation portion. Also, no narrow portion appears in the p-type formation portion nor the n-type formation portion. This makes the pattern formation easy. In addition, the cell width (size in the X direction) of the tap cell is smaller than in the layout structure of FIG. 10.

Other Embodiment (No. 1)

While the planar shape of the VNWs is a circle in the layout structures described above, it is not limited to a circle. For example, the planar shape of the VNWs can be a rectangle or an oval. When the VNWs have a planar shape extending long in one direction like an oval, the extension direction is preferably uniform. Also, the positions of the ends are preferably aligned.

All VNWs in one tap cell do not necessarily have the same shape, but VNWs having different planar shapes may be mixed in one tap cell.

(No. 2)

While the VNW FETs and the pseudo VNW FETs are each constituted by two VNWs in the layout structures described above, the number of VNWs constituting each of the VNW FETs and the pseudo VNW FETs is not limited to this.

According to the present disclosure, a tap cell can be implemented in a semiconductor integrated circuit device provided with VNW FETs. The present disclosure is therefore useful for improvement in the performance of a semiconductor chip, for example.

What is claimed is:

1. A semiconductor integrated circuit device provided with vertical nanowire (VNW) FETs, comprising:
    a first standard cell,
    wherein the first standard cell includes:
        a first power supply interconnect extending in a first direction, configured to supply a first power supply voltage, and
        a first bottom region of a first conductivity type formed in a top portion of a well or substrate of the first conductivity type, and
        the first bottom region overlaps the first power supply interconnect as viewed from top and is connected with the first power supply interconnect, and
        the first standard cell includes at least one first pseudo VNW FET having a bottom connected with the first bottom region, the at least one first pseudo VNW FET does not constitute a transistor.

2. The semiconductor integrated circuit device of claim 1, wherein the first standard cell includes:
    a second power supply interconnect extending in the first direction, configured to supply a second power supply voltage, and
    a second bottom region of a second conductivity type formed in a top portion of a well or substrate of the second conductivity type, and
    the second bottom region overlaps the second power supply interconnect as viewed from top and is connected with the second power supply interconnect.

3. The semiconductor integrated circuit device of claim 2, wherein the first standard cell includes at least one second pseudo VNW FET having a bottom connected with the second bottom region.

4. The semiconductor integrated circuit device of claim 2, wherein the first bottom region and the second bottom region are the same in position and size in the first direction.

5. A semiconductor integrated circuit device provided with vertical nanowire (VNW) FETs, comprising:
    a first standard cell,
    wherein the first standard cell includes:
        a first power supply interconnect extending in a first direction, configured to supply a first power supply voltage,
        a first bottom region of a first conductivity type formed in a top portion of a well or substrate of the first conductivity type,
        a second power supply interconnect extending in the first direction, configured to supply a second power supply voltage, and
        a second bottom region of a second conductivity type formed in a top portion of a well or substrate of the second conductivity type, and
    the first bottom region overlaps the first power supply interconnect as viewed from top and is connected with the first power supply interconnect,
    the second bottom region overlaps the second power supply interconnect as viewed from top and is connected with the second power supply interconnect, and
    the first bottom region and the second bottom region are the same in position and size in the first direction.

6. The semiconductor integrated circuit device of claim 5, wherein the first standard cell includes at least one first pseudo VNW FET having a bottom connected with the first bottom region.

7. The semiconductor integrated circuit device of claim 5, wherein the first standard cell includes at least one second pseudo VNW FET having a bottom connected with the second bottom region.

* * * * *